US008049216B2

United States Patent
Li et al.

(10) Patent No.: US 8,049,216 B2
(45) Date of Patent: Nov. 1, 2011

(54) THIN FILM TRANSISTOR, ARRAY SUBSTRATE AND METHOD FOR MANUFACTURING THE SAME

(75) Inventors: Xinxin Li, Beijing (CN); Wei Wang, Beijing (CN); Chunping Long, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 12/104,575

(22) Filed: Apr. 17, 2008

(65) Prior Publication Data

US 2008/0296575 A1 Dec. 4, 2008

(30) Foreign Application Priority Data

May 30, 2007 (CN) .......................... 2007 1 0099777

(51) Int. Cl.
*H01L 29/04* (2006.01)
*H01L 29/10* (2006.01)

(52) U.S. Cl. ... 257/59; 257/288; 257/365; 257/E51.005; 257/E51.006; 257/E29.151; 349/48; 349/139; 349/141; 349/142

(58) Field of Classification Search .............. 257/72, 257/E21.001, E33.053, E21.414, E21.409, 257/365, 59, 40, 288, 88, E31.124, E21.046, 257/E21.061, E51.005, E51.006, E29.151; 438/30, 34, 151, 160, 250; 349/54, 56, 141, 349/139, 48, 142; 345/98, 87
See application file for complete search history.

(56) References Cited

U.S. PATENT DOCUMENTS

| 3,643,139 | A  | * | 2/1972  | Nienhuis ........................ 257/365 |
| 5,757,444 | A  | * | 5/1998  | Takemura ........................ 349/38 |
| 6,087,678 | A  | * | 7/2000  | Kim ................. 257/59 |
| 6,239,468 | B1 | * | 5/2001  | Chang et al. .................. 257/347 |
| 6,483,565 | B1 | * | 11/2002 | Hidehira et al. .............. 349/141 |
| 6,504,523 | B1 | * | 1/2003  | Sugawara et al. ............... 345/98 |
| 2002/0080100 | A1 | * | 6/2002 | Son et al. ........................ 345/87 |
| 2002/0140650 | A1 | * | 10/2002 | Kai et al. ........................ 345/87 |
| 2002/0186331 | A1 | * | 12/2002 | Chung ........................... 349/43 |
| 2004/0173795 | A1 | * | 9/2004  | Moon et al. ..................... 257/59 |
| 2004/0263745 | A1 | * | 12/2004 | Lee et al. ....................... 349/139 |
| 2005/0094050 | A1 | * | 5/2005  | Chung ........................... 349/56 |
| 2005/0173701 | A1 | * | 8/2005  | Kawase et al. .................. 257/40 |
| 2006/0214197 | A1 | * | 9/2006  | Nakamura et al. ............. 257/288 |
| 2007/0290205 | A1 | * | 12/2007 | Chen et al. ..................... 257/59 |

\* cited by examiner

*Primary Examiner* — Colleen Matthews
*Assistant Examiner* — Galina Yushina
(74) *Attorney, Agent, or Firm* — Hasse & Nesbitt LLC; Daniel F. Nesbitt

(57) ABSTRACT

A thin film transistor for a thin film transistor liquid crystal display (TFT-LCD), an array substrate and manufacturing method thereof are provided. The thin film transistor comprises a source, a drain, and a channel region between the source and drain. A source extension region is connected with the source, a drain extension region is connected with the drain, and the source extension region is disposed opposite to the drain extension region to form a channel extension region therebetween.

18 Claims, 4 Drawing Sheets

THIN FILM TRANSISTOR, ARRAY SUBSTRATE AND METHOD FOR MANUFACTURING THE SAME

FIELD OF THE INVENTION

The present invention relates to a thin film transistor for a liquid crystal display (LCD), an array substrate and a method of manufacturing the same.

BACKGROUND OF THE INVENTION

With rapid spread and wide application of thin film transistor liquid crystal displays (TFT-LCDs), there is an increasing demand for a larger display screen, and thus pixels for display are also becoming larger, which in turn imposes a high requirement on the magnitude of the charging current. How to improve the charging current of the pixels has become critical in the technology.

A typical TFT-LCD comprises a TFT array substrate and a color filter substrate arranged in parallel to each other. Spacers are interposed between the two substrates to provide a space for filling liquid crystal therein. On the TFT array substrate, gate lines and data lines (signal lines) that intersect with each other to define pixels, and at the intersection between a gate line and a data line, there is provided a TFT as a switching element for the corresponding pixel. The TFT comprises a gate electrode connected with the gate line, a source electrode connected with the data line, and a drain electrode connected with a pixel electrode of the corresponding pixel. The voltage applied on the gate electrode over the gate line controls the on/off state of the TFT, that is to say, whether the pixel electrode of the pixel is charged with charging current passing through the TFT channel from the data line.

FIGS. 1 and 2 are diagrams showing a conventional pixel structure of a TFT. As shown in FIG. 2, a bottom gate type TFT comprises a gate electrode 1, which is formed on a substrate 100 and connected with a gate line, a gate insulation layer 14, a semiconductor layer 3, a source electrode 5 and a drain electrode 4, and a passivation layer 15, which are formed on the gate electrode 1 in the order. The semiconductor layer 3 comprises a channel region between the source electrode 5 and the drain electrode 4. A transparent pixel electrode 7 is formed on the passivation layer 15 and connected with the drain electrode 4 via a through hole. When the gate electrode 1 is at a voltage of high level, induced charges are generated in the semiconductor layer (e.g., an amorphous silicon (a-Si) layer) 3 of the TFT, so the channel of the TFT is turned to "on" state, and the charges flow from the drain electrode 4 to the source electrode 5. The transparent pixel electrode 7 is charged in accordance with the magnitude of the voltage signal supplied over a signal line 2 (FIG. 1) to display a desired image.

The magnitude of the charging current passing through the TFT channel can be calculated with the following formula (1-1) and is in direct proportion to the ratio of width to length (W/L) of the channel, wherein W denotes the width of the channel, and L denotes the length of the channel. Therefore, the efficient and popular method is to increase W/L of the channel by modifying the design of the channel structure, so as to increase the charging current of the TFT. A conventional charging channel structure is shown in FIG. 3, wherein W=W1+W2+W3, L=L0 and a U-type channel structure with a single source electrode 5 and a single drain electrode 4 is employed. A large-size TFT-LCD generally needs a larger charging current. However, the conventional charging channel structure may lead to many failures due to the insufficient charging current and thus cannot satisfy the demand for a higher charging current of a TFT-LCD.

The formula of calculating the charging current of a TFT is as follows:

$$I_{on} = \mu C_{ox} W/L[(V_{gs}-V_{th})-V_{ds}/2]V_{ds} \quad (1\text{-}1).$$

The ratio of width to length (W/L) of the conventional channel structure is calculated as follows:

$$W/L = \frac{W_1 + W_2 + W_3}{L_0}. \quad (1\text{-}2)$$

To increase the W/L of the channel, a conventional method is to adopt a channel structure with a plurality of sources and drains. FIG. 4 shows a diagram of a conventional multi-channel design. As shown in FIG. 5, there are two or more U-type channel structures, and therefore the width of the channel can be enlarged. The W/L of the channel and thus the charging current can be increased. However, because the above design employs two or more sources 5, the aperture ratio of the pixel regions of the LCD decreases and the display brightness and contrast ratio of the TFT-LCD decrease.

SUMMARY OF THE INVENTION

In view of the above problems in the related art, the objects of the present invention are to provide a thin film transistor for a TFT-LCD to increase the charging current ($I_{on}$), decrease the failure due to the insufficient charging, and improve the display quality without decreasing the aperture ratio of the pixel region.

In a first aspect, the present invention provides a thin film transistor, comprising a source electrode, a drain electrode, and a channel region between the source electrode and drain electrode. A source extension region is connected with the source electrode, a drain expanded region is connected with the drain electrode, and the source extension region is disposed opposite to the drain extension region to form a channel extension region therebetween.

In a second aspect, the present invention provides a thin film transistor array substrate comprising the above thin film transistor.

In a third aspect, the present invention provides a method of manufacturing a thin film transistor array substrate, comprising the step of forming a thin film transistor on a substrate as a switch device of a pixel unit. When forming a source electrode and a drain electrode of the thin film transistor, a source extension region connected with the source electrode and a drain extension region connected with the drain electrode are formed, and the source extension region and the drain extension region are disposed opposite to each other to form a channel extension region therebetween.

Compared with the conventional technology, the embodiments of the present invention increase the charging current of the pixel region of the TFT by extending the channel and increase the ration of the width to length of the channel (W/L) without decreasing the aperture ratio. The display failures such as bright spot and gray level non-uniformity are efficiently avoided.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWING

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

Figure 6:
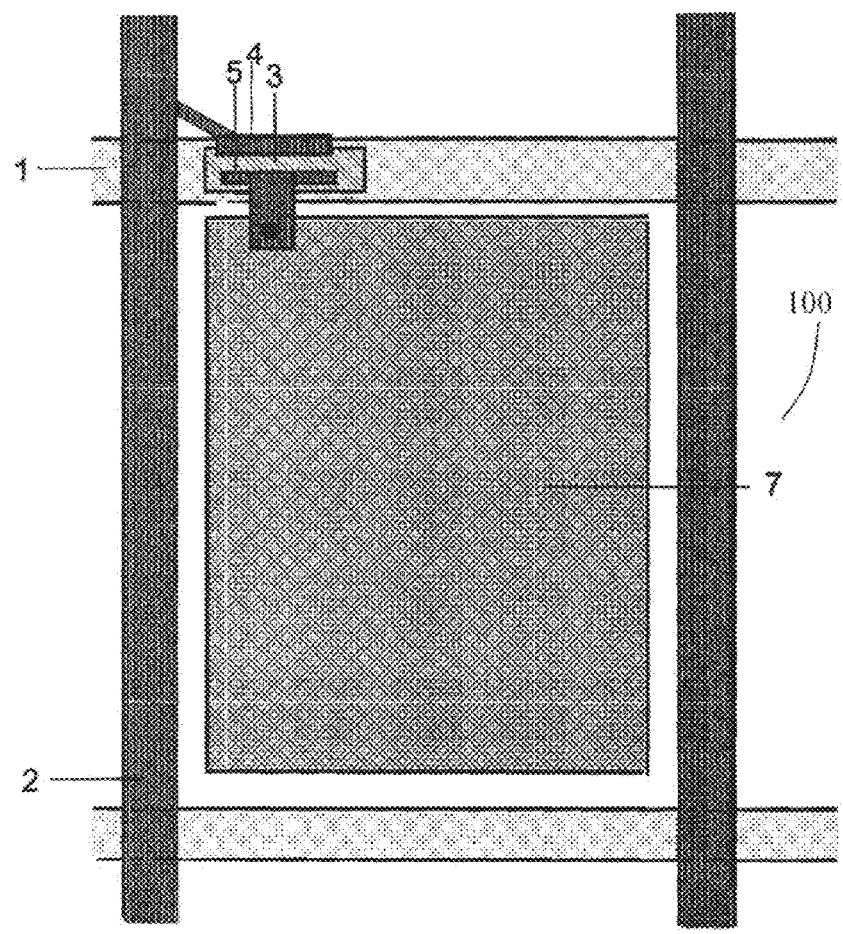
FIG. 6 is a diagram of a TFT-LCD pixel structure with a single source electrode and a single drain electrode according to an embodiment of the present invention.

FIG. 6 is a diagram of a TFT-LCD pixel structure according to an embodiment of the present invention. The TFT channel structure according to the embodiments of the present invention comprises a source electrode, a drain electrode, a channel region, and a channel extension region. According to the embodiment of the present invention, the charging current of the TFT pixel region is increased due to the increased W/L of the channel by extending the channel region. Therefore, the display failures such as bright spot and gray level non-uniformity (mura) can be efficiently avoided.

Embodiment 1

Figure 7:
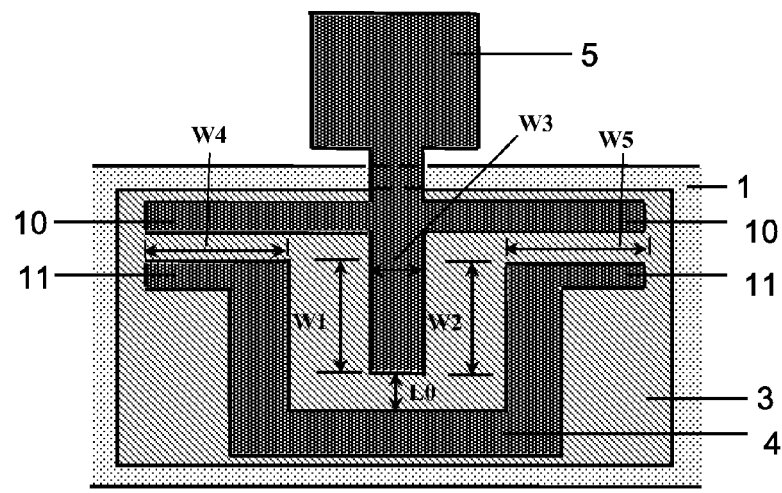
FIG. 7 is a diagram of a TFT-LCD channel structure with a single source electrode and a single drain electrode according to a first embodiment of the present invention.

FIG. 7 is a diagram of a TFT-LCD channel structure according to a first embodiment of the present invention. As shown in FIG. 7, the TFT channel structure comprises a source electrode 5, a drain electrode 4, a U-type channel region, and a channel extension region (between a source extension region 10 and a drain extension region 11). The source extension region 10 and the source electrode 5 vertically intersect with each other and form an integrated structure together. The drain electrode 4 is a U-type drain. The drain extension region 11 is formed at both ends of the U-type drain electrode 4 and forms an integrated structure with the drain electrode 4. The channel extension region is formed between the source extension region 10 and the drain extension region 11 and extends at both sides of the U-type channel formed between the source electrode 5 and the U-type drain electrode 4. The extension region comprises the same metal material as that used for the signal line and the source electrode and drain electrode, such as a material selected from the group consisting of AlNd, Al, Cu, Mo, MoW, Cr and any combination thereof, and is manufactured in the same photolithography process as that for the source electrode and drain electrode. All the channel regions are formed over a gate electrode (or a gate line) 1, a gate insulating layer (not shown) and a semiconductor layer 3. The gate electrode 1, the gate insulating layer and the semiconductor layer 3 form an overlapped structure one on the other.

Figure 1:
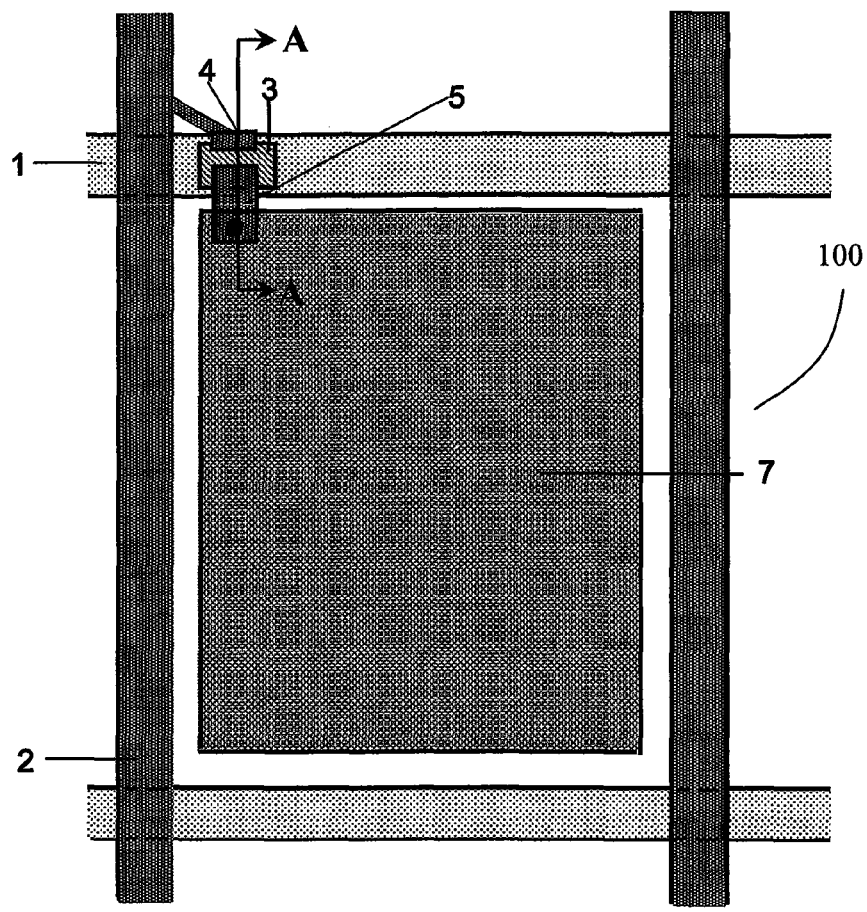
FIG. 1 is a diagram of a structure of a conventional pixel in the related art.
Figure 2:
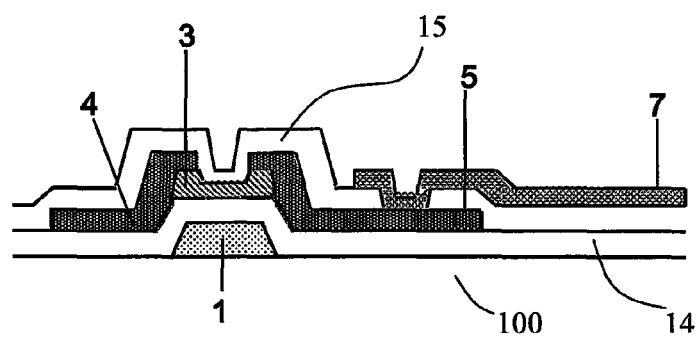
FIG. 2 is a cross-section view taken along line A-A in FIG. 1.
Figure 3:
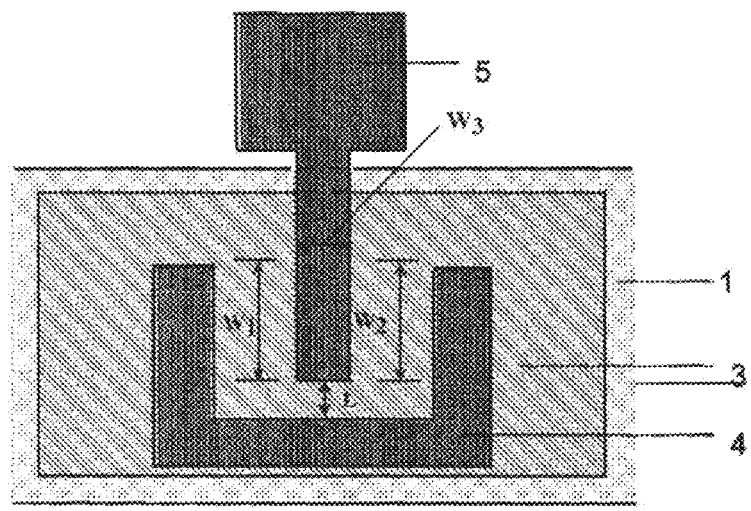
FIG. 3 shows a TFT charging channel structure in a conventional technology.
Figure 4:
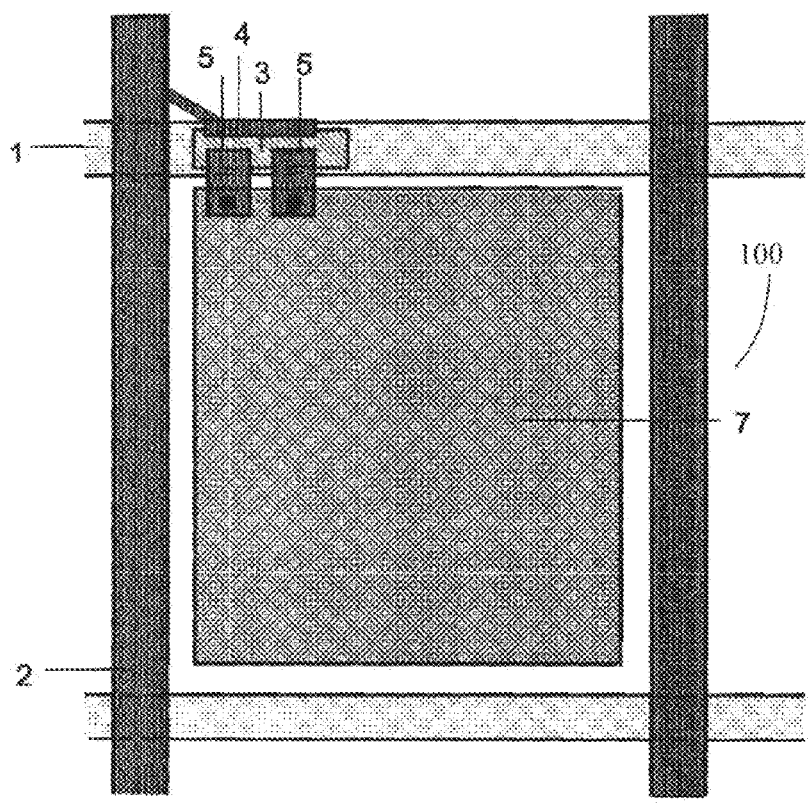
FIG. 4 is a diagram of a pixel structure with two source electrodes and drain electrodes in a conventional technology.
Figure 5:
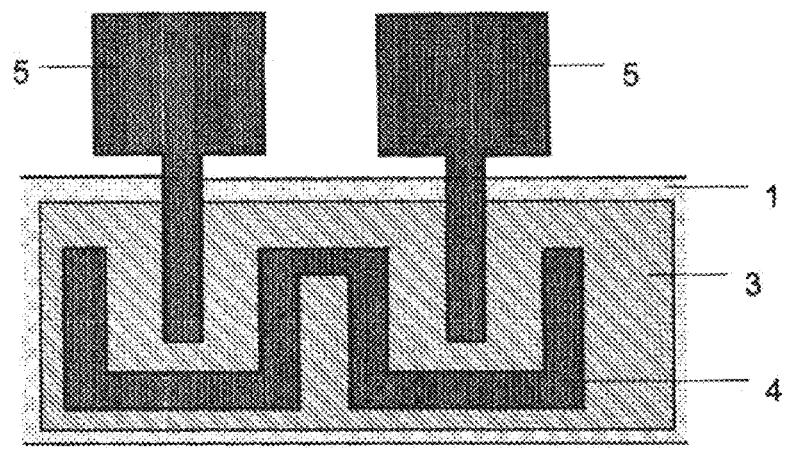
FIG. 5 is a diagram of a TFT channel structure with two source electrodes and drain electrodes.

As shown in FIG. 7, compared with the channel structure in the related art as shown in FIG. 3, the extension channel structure according to the embodiment of the present invention increases the total width of the channel (W4 and W5 denote the increased portion of the channel width, respectively). With formulas (1-1) and (1-2), the W/L of the present embodiment is larger than that of the conventional design, and the charging current is increased with the increase of the W/L. In this embodiment, the channel extension region is in a straight bar shape.

The W/L according to the present embodiment can be calculated as follows:

$$W/L = \frac{W_1 + W_2 + W_3 + W_4 + W_5}{L0} \quad (1\text{-}3)$$

From formula (1-3), the W/L is increased due to the channel extension region according to the present embodiment, the charging current of the TFT pixel can be efficiently increased in turn, and the display failures such as bright spot and gray level non-uniformity are efficiently avoid accordingly.

In addition, since there is only a single source 5 in the present embodiment, the aperture ratio is not decreased.

Embodiment 2

Figure 8:
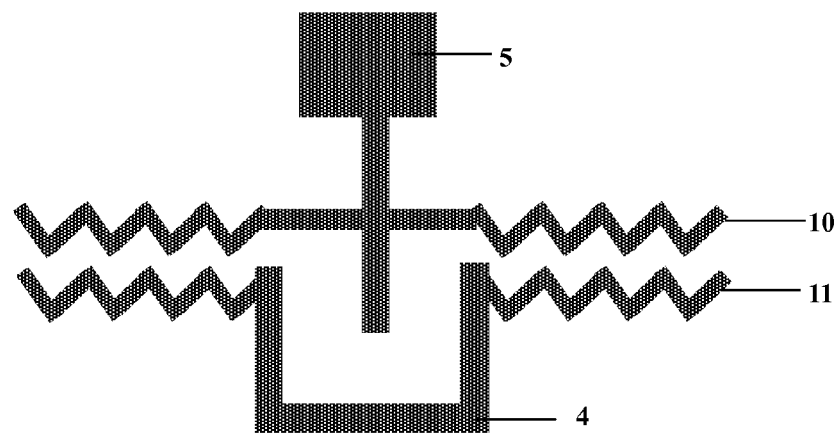
FIG. 8 is a diagram of a TFT-LCD channel structure with a single source electrode and a single drain electrode according to a second embodiment of the present invention.

FIG. 8 is a diagram of a TFT-LCD channel structure with a single source electrode and a single drain electrode according to a second embodiment of the present invention. As shown in FIG. 8, the TFT channel structure comprises a source electrode 5, a drain electrode 4, a U-type channel region and a channel extension region (between a source extension region 10 and a drain extension region 11). The source extension region 10 and the source electrode 5 vertically intersect with each other and form an integrated structure together. Here, the drain electrode 4 is a U-type drain. The drain extension region 11 is formed at both sides of the U-type drain electrode 4 and forms an integrated structure with the drain electrode 4. The above structure is the same as that in embodiment 1, and the difference between embodiment 2 and embodiment 1 lies in that the source extension region 10 and the drain extension region 11 are disposed opposite to each other in the form of a zigzag or corrugation shape. Because the length between the source extension region 10 and the drain extension region 11 is not changed substantially and still L0, and the width W4 and W5 are further increased due to the zigzag or corrugation shape, from the formula (1-3), the present embodiment further increases the W/L of the channel. At the same time, the charging current of the TFT pixel region is efficiently increased, and thus the display failures such as bright spot and gray level non-uniformity can be efficiently avoided. Also, since there is only a single source electrode 5 in the present embodiment, the aperture ratio is not decreased.

In another embodiment of the present embodiment, a TFT array substrate using a TFT such as those shown in FIG. 7 or 8 as a switch device and the manufacturing method thereof are provided. In general, depending on the position relationship between the gate electrode and the source electrode and drain electrode, a TFT can be classified as a bottom gate type TFT, a top gate type TFT, or a plain type TFT, the configuration of which are well-known in the art. The TFT according to the embodiments of the present invention modifies the configuration of the channel region compared with the conventional TFT. In manufacturing, for example, for a bottom gate type TFT, a gate electrode, a gate insulating layer, and a semiconductor layer can be formed on the substrate in this order by using a photolithography method and an etching method, then a source electrode and a drain electrode are formed on the semiconductor layer. With forming of the source electrode and drain electrode, a source extension region connected with the source electrode and a drain extension region connected with the drain electrode are formed in the same process, and the source extension region and the drain extension region are disposed opposite to each and form a channel extension region therebetween. The processes to form the gate electrode, the gate insulation layer, the semiconductor layer, etc. in a TFT are the well-known ones in the art, for example, including a deposition process such as CVD or PVD, a etching process such as dry etching or wet etching, and so on, the description of which are omitted herein for simplicity.

In summary, embodiments of the present invention increase the W/L of the channel of TFT by extending, for example, a U-type channel region, and the single source channel structure formed by extending the source electrode and drain electrode should fall into the scope and spirit of the present invention, irrespective of the shape of the channel, the type of the TFT (a bottom gate TFT or a top gate TFT).

It should be noted that although the present invention has been described in detail referring to the preferred embodiments, the above embodiments are used only for illustration and not for the purpose of limitation. Accordingly, it will be understood by those of ordinary skill in the art that it is possible to use other materials and equipments if necessary, and that various modifications or equivalent alterations may be made to the embodiments of the present invention without departing from the spirit and scope of the present invention as set forth in the following claims.

What is claimed is:

1. A thin film transistor array substrate, comprising a thin film transistor as a switch device of a pixel unit on a substrate, the thin film transistor comprising a source electrode that is connected to a pixel electrode and that extends over a gate line, a drain electrode that is connected to a data line and having a U-type shape, and a channel region between the source electrode and the drain electrode,
and further comprising a source extension region formed on the source electrode and connected to the pixel electrode through the source electrode, wherein the source extension region extends perpendicular to and crosses over the source electrode to form a cross-type shape, and a drain extension region formed at both ends of the U-type shaped drain electrode and extending outwards therefrom;
the source extension region being disposed opposite to the drain extension region to form a channel extension region therebetween, and the source extension region and the drain extension region extending over the gate line in a direction parallel to an extension direction of the gate line on the substrate.

2. The thin film transistor array substrate according to claim 1, wherein both of the source extension region and the drain extension region overlap the gate line, a gate insulation layer and a semiconductor layer.

3. The thin film transistor array substrate according to claim 1, wherein the source extension region and the source electrode form an integrated structure together.

4. The thin film transistor array substrate according to claim 3, wherein the channel extension region is in a straight bar shape.

5. The thin film transistor array substrate according to claim 3, wherein the source extension region and the drain extension region are in a zigzag shape.

6. The thin film transistor array substrate according to claim 1, wherein a material for the source electrode, the drain electrode, the source extension region, and the drain extension region is selected from the group consisting of AlNd, Al, Cu, No, MoW, Cr and any combination thereof.

7. A thin film transistor array substrate, comprising a thin film transistor as a switch device of a pixel unit on a substrate, the thin film transistor comprising:
a) an extending source electrode connected to a pixel electrode and extending over a gate line, the extending source electrode including a source extension region that is connected to the pixel electrode through the source electrode, extends from both sides of the extending source electrode and forms a cross-type shape with the source electrode in a direction parallel to an extension direction of the gate line on the substrate;
b) a drain electrode connected to a signal line and having a U-type shape with at least two ends, the drain electrode including a drain extension region that extends from both ends of the drain electrode disposed opposite the source extension region and is extended over the gate line in a direction parallel to the extension direction of the gate line on the substrate; and
c) a channel region between the extending source electrode and the drain electrode, including a channel extension region between the drain extension region and the source extension region.

8. The thin film transistor array substrate according to claim 7, wherein the source extension region and the source electrode vertically intersect with each other and form an integrated structure together.

9. The thin film transistor array substrate according to claim 7, wherein the source extension region and the source electrode form an integrated structure together.

10. The thin film transistor array substrate according to claim 9, wherein the channel extension region is in a straight bar shape.

11. The thin film transistor array substrate according to claim 9, wherein the channel extension region is in a zigzag shape.

12. The thin film transistor array substrate according to claim 7, wherein a material for the source electrode, the drain electrode, the source extension region, and the drain extension region is selected from the group consisting of AlNd, al, Cu, Mo, MoW, Cr and any combination thereof.

13. A method of manufacturing a thin film transistor array substrate comprising a thin film transistor as a switch device of a pixel unit on a substrate, the thin film transistor comprising a source electrode that is connected to a pixel electrode and extends over a gate line, a drain electrode that is connected to a data line and having a U-type shape, and a channel region between the source electrode and the drain electrode,
and further comprising a source extension region formed on the source electrode and connected to the pixel electrode through the source electrode, wherein the source extension region extends perpendicular to and crosses over the source electrode to form a cross-type shape, and a drain extension region formed at both ends of the U-type shaped drain electrode and extending outwards therefrom;

the source extension region being disposed opposite to the drain extension region to form a channel extension region therebetween, and the source extension region and the drain extension region extending over the gate line in a direction parallel to an extension direction of the gate line on the substrate, wherein when forming the source electrode and the drain electrode of the thin film transistor, the source extension region connected with the source electrode and the drain extension region connected with the drain electrode are formed, and the source extension region and the drain extension region are disposed opposite to each other to form the channel extension region therebetween.

14. The method according to claim 13, wherein both of the source extension region and the drain extension region overlap the gate line, a gate insulation layer, and a semiconductor layer.

15. The method according to claim 13, wherein the source extension region and the source electrode form an integrated structure together.

16. The method according to claim 15, wherein the channel extension region is in a straight bar shape.

17. The method according to claim 15, wherein the source extension region and the drain extension region are in a zigzag shape.

18. The method according to claim 13, wherein a material for the source electrode, the drain electrode, the source extension region, and the drain extension region is selected from the group consisting of AlNd, Al, Cu, No, MoW, Cr and any combination thereof.

* * * * *